United States Patent [19]

Rehder

[11] Patent Number: 4,906,974

[45] Date of Patent: Mar. 6, 1990

[54] PROCESS FOR DEACTIVATING A RESONANCE LABEL, AND CIRCUIT ARRANGEMENT FOR CARRYING OUT THE PROCESS

[75] Inventor: Jürgen Rehder, Bexbach-Höchen, Fed. Rep. of Germany

[73] Assignee: Durgo AG, Switzerland

[21] Appl. No.: 185,037

[22] Filed: Apr. 22, 1988

[30] Foreign Application Priority Data

Apr. 23, 1987 [CH] Switzerland .......................... 1564/87

[51] Int. Cl.[4] ........................ G08B 13/24; H01Q 1/36; H05K 1/16

[52] U.S. Cl. .................................... 340/551; 340/572; 343/895; 361/402

[58] Field of Search .................. 340/551, 572, 825.57; 343/895; 361/402

[56] References Cited

U.S. PATENT DOCUMENTS

| | | | |
|---|---|---|---|
| 4,686,516 | 8/1987 | Humphrey | 340/572 |
| 4,736,207 | 4/1988 | Siikarla et al. | 343/895 |
| 4,797,785 | 1/1989 | Jorgensen | 361/402 |

*Primary Examiner*—Glen R. Swann, III
*Assistant Examiner*—Thomas J. Mullen, Jr.
*Attorney, Agent, or Firm*—Ostrolenk, Faber, Gerb & Soffen

[57] ABSTRACT

A resonance label (E) is deactivated by transmitting only a single discharge pulse which produces only a click signal instead of an oscillation and destroys the label (E). A discharge capacitor (C1) which is connected in series with a transmitting antenna (L1) and is rechargeable via a switching system (LDR, 1-5) preferably serves as the energy source for delivering the discharge pulse.

21 Claims, 1 Drawing Sheet

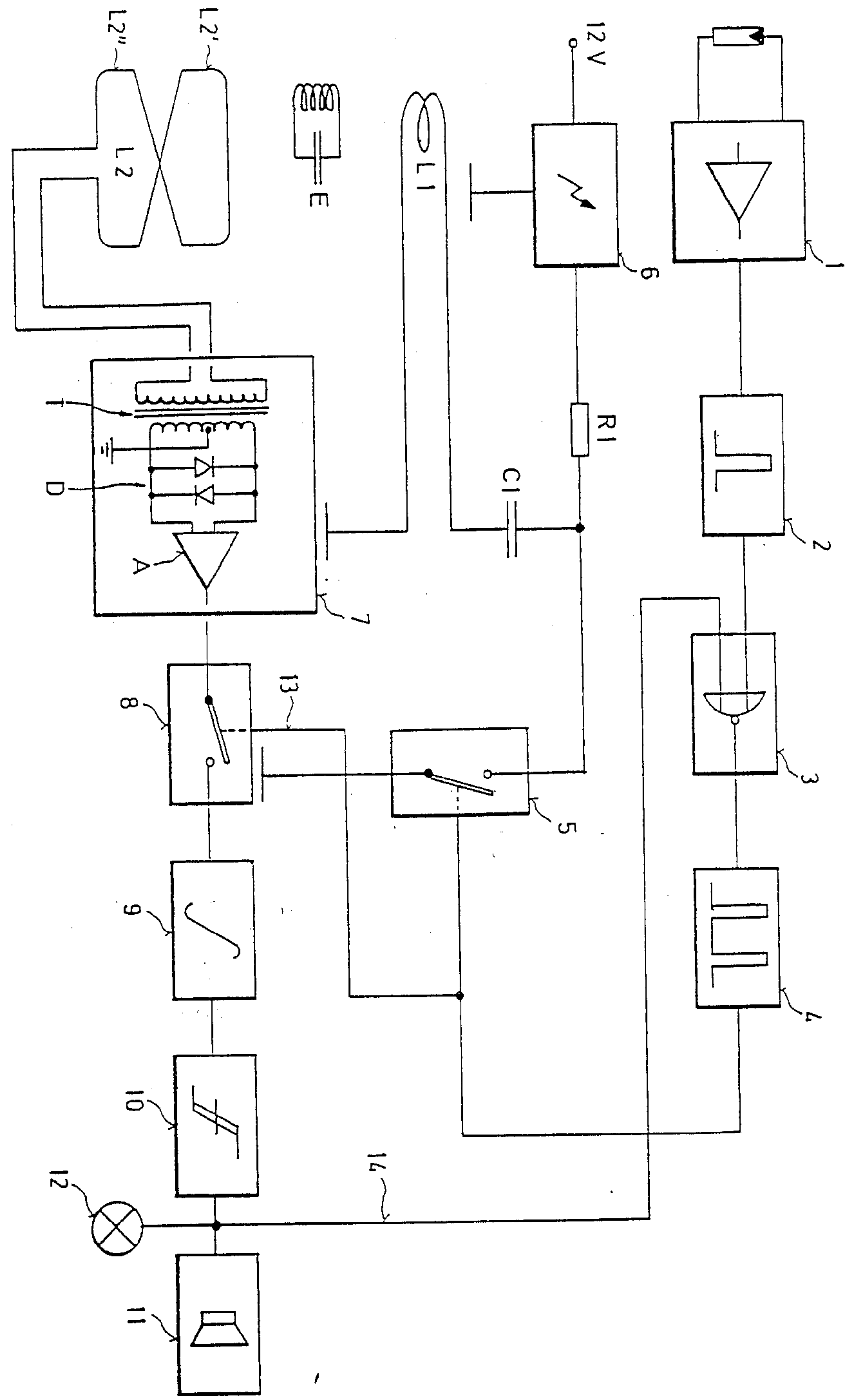
L2"
L2'
L2
E
L1
12 V
6
1
R1
C1
2
T
D
A
7
13
8
5
3
9
4
10
14
12
11

PROCESS FOR DEACTIVATING A RESONANCE LABEL, AND CIRCUIT ARRANGEMENT FOR CARRYING OUT THE PROCESS

BACKGROUND OF THE INVENTION

The invention relates to a process according to the preamble of claim 1 and to a circuit arrangement for carrying out the process.

In department stores, goods are protected from theft by attaching to them resonance labels which have to be deactivated on payment at the checkout, or may have to be deactivated only on acceptance of the goods at the packaging counter after presentation of the checkout slip. If the label is not deactivated, this is detected by a monitoring system which is arranged in the exit area and which excites the labels to produce resonance and detects a non-deactivated label from the resonance.

Deactivation is conventionally effected by exciting the label with about 10 times its power, which causes the oscillating circuit or its capacitor to burn through. The high surge current may however also trigger an alarm at the exit of the department store, especially if the checkout is arranged sufficiently close. This danger can be eliminated only by expensive circuitry. Another difficulty is that such high transmitter powers (and such a high power is in fact involved in this case) require approval from the Federal Communications Commission or another Government authority and this is difficult to obtain (if it can be obtained at all). In order to eliminate false alarms, the monitoring means can be synchronized with the checkout in such a way that monitoring is interrupted at the instant when the checkout transmits a deactivating surge current. Particularly where there are several checkouts, this would mean that the monitoring means will in the end be switched off more than switched on, so that a thief with stolen goods may nevertheless be able to slip through.

SUMMARY OF THE INVENTION

It is the object of the invention to provide a process of the type stated at the outset and an associated circuit arrangement so that checking of the resonance labels and deactivation can be carried out without interruption.

A first step in achieving this object makes use of the fact that it is not at all necessary to deliver the resonance frequency for deactivating the label, but that, with an appropriate power, a single click pulse is sufficient to excite the oscillating circuit of the label to self-destruction. In the language used in the telephone field, the term "click disturbance" is usual when referring to a telephone line; a single pulse consisting of one such interfering signal is accordingly a click pulse.

On the basis of this knowledge, the object of the invention is achieved essentially by the features of the defining clause of claim 1.

To be sure that the particular resonance label is deactivated, the procedure according to claim 3 may be adopted, in which the label is deactivated by a further pulse if deactivation does not occur directly with the first pulse. However, it is also possible to adopt the method according to claim 4, in which both processes are preferably combined with one another by transmitting at least one second discharge pulse, which may also be used for checking.

A circuit arrangement for carrying out the process according to the invention is defined by the features of claim 5.

Every embodiment of the invention has several advantages:

Since only a single pulse is required, the energy requirement is reduced, so that it is possible to use a battery-operated manual device for deactivation, which facilitates handling and widens the range of potential uses;

Since the monitoring means are tuned to a pulse series, a single pulse can no longer cause problems;

This dispenses with the previously required synchronization between the deactivating device at the checkout or at the packaging counter, on the one hand, and the monitoring means, and the circuit arrangement is simplified;

Moreover, restrictions imposed by the Government authorities are also dispensed with, i.e. permission is no longer required;

Furthermore, the environment or receivers arranged in the environment are no longer exposed to any extraneous radiation;

The system is more reliable since variations in the quality of the oscillating circuit of the label have less influence on the energy required to destroy the label than was previously the case with delivery of a sequence of oscillations;

Finally, the circuit arrangement for deactivation is also simpler since it need not contain any balancing elements;

In addition, deactivation takes place more rapidly than previously.

BRIEF DESCRIPTION OF THE DRAWING

Further details of the invention are shown in the following description of an embodiment illustrated schematically in the drawing.

DETAILED DESCRIPTION

It is assumed that goods provided with a resonance label E are either brought to the checkout or collected from a packaging counter after payment at the checkout.

In any case, the resonance label E must be deactivated after the goods have been paid for, this being initiated by actuating a switching element. This switching element may simply be a switch to be operated manually, for example by the checkout assistant, but is preferably formed by a sensor LDR which automatically determines the arrival of the goods and puts the deactivating circuit into operation. In the embodiment shown, the sensor LDR is formed by a light barrier or a light reflector having a photoelectric converter LDR, but various alternate embodiments are possible, for example a piezoelectric detector which detects the weight of the goods on a base, or a circuit which resembles the checking circuit at the department store exit and transmits a resonance vibration and, from the "echo" from the label E, detects the presence of the latter.

Down-circuit of the sensor LDR is an amplifier 1, in particular one with high amplification, such as a threshold circuit which converts the voltage change at the output of the sensor LDR into a voltage transient. A timing element 2, in particular a monoflop, which keeps a down-circuit OR element 3 open for a predetermined time, is tripped by this transient signal, if necessary via a coupling capacitor which delivers a needle pulse.

As the coupling capacitor delivering a needle pulse just mentioned here, it should be noted that this capacitor may be the one which delivers the discharge pulse to a transmitting aerial L1, instead of the capacitor C1 described below. However, the embodiment described below with reference to the drawing, including the function of the stages 3 and 4 shown, is more advantageous.

Via the OR gate 3, a pulse generator 4 is switched on and delivers at least two, preferably more than two, pulses with intermediate pulse intervals. The pulse interval times are preferably a multiple of the pulse times. As will be described below, the pulse sequence delivered in this way serves a dual purpose, i.e. on the one hand to ensure destruction of the resonance label E (if this has not already been effected with the first pulse) and, on the other hand, to check for successful destruction. Since in fact the procedure employs as little energy as possible, destruction may be unsuccessful if the label E is arranged, for example, on a very large piece of goods in a position remote from the transmitting antenna L1, for example on the underneath. If, in such a case, the test circuit described below determines that the oscillating circuit of the label E is still intact (and therefore could trigger a false theft alarm at the exit of the department store due to the checking means mounted there), it is merely necessary to turn the goods around and to repeat the deactivation.

A voltage converter 6 charges a capacitor C1 via a resistor R1. When a resistor is mentioned here, it is understood as meaning any circuit which provides a resistance to current. It is known, for example, that transistors too can be operated as variable resistors. The capacitor C1 is earthed via a controllable switch 5, the switch 5 being closed by the pulses from the pulse generator 4. It is therefore clear that the pulse interval times must be such that the capacitor C1 can be recharged by the voltage converter 6 in this time.

The above description indicates a further possible modification: the timing element 2 operates here to a certain extent as a gate circuit for fixing the number of pulses to be delivered by the pulse generator 4. It would therefore easily be possible to mount a gate circuit at the output of a freely running pulse generator 4 and to let pulses through only during a predetermined time. It would also be possible, instead of the timing element 2, to have the pulse generator 4 in the form of a start-stop generator which, after being triggered by the pulse from the amplifier 1, delivers a predetermined number of pulses. The ratio of pulse time to interval time can advantageously be of the order of magnitude of 1:10000.

The pulse intervals between the pulses of the pulse generator 4 will be discussed again here. In a generator of this type, the pulse intervals are normally always of the same magnitude, and the pulses are produced periodically. However, this means that the pulses are delivered at a predetermined frequency. This may be a disadvantage for the present purposes if such a frequency is expected to produce faults. It is therefore expedient to make the pulse intervals non-uniform by means of an appropriate circuit of the pulse generator 4. This may be effected either if they are determined by a connected or integrated random pulse generator or—as is preferred—if they are changed, i.e. either lengthened or shortened after each pulse, according to a predetermined law; the extent of this change may be constant or variable.

Whenever the switch 5 is closed by means of a pulse emitted by the pulse generator 4, the capacitor C1 discharges, and this discharge pulse (=click pulse) is transmitted to the transmitting coil L1. The pulse delivered in this manner has been found to be sufficient to destroy the resonance label E, since this pulse causes the said label to undergo auto-oscillations, which then decay exponentially unless destruction takes place beforehand. Destruction is usually generally effected at the capacitor of the oscillating circuit of the label.

If, on the other hand, no destruction occurs and the induced oscillation of the label E decays after receipt of a discharge pulse from the transmitting antenna L1, this can preferably be detected with the aid of a test circuit which has a receiving antenna L2 for picking up the induced oscillation of the label E.

A comment on the form of the capacitor C1 should be made here. This must in any case be such that, on the one hand, the label E is destroyed with a high degree of reliability at the first discharge pulse, so that the pulses subsequently delivered serve as far as possible only for carrying out the test. On the other hand, it should be sufficiently small so that the discharge pulse does not have an excessively high energy content and cannot cause disturbances. It has been found that a maximum magnitude of 60 nF, preferably 50 nF, is completely sufficient, and that a range which is more expedient in practice is from 5 to 30 nF. For example, a value of 10 nF ±5 nF is quite realistic.

The receiving and test antenna L2 may be arranged together with the transmitting antenna L1. However, the transmitting antenna L1 may also be provided on the checkout, and the test antenna L2 may be provided on the packaging counter. It is in theory also possible to propose a procedure similar to that known from radar and echo-sounding technology, by using one and the same antenna as a transmitting antenna and then as a receiving antenna, this being achieved by switching. However, this is not in general a preferred procedure for the present purposes, as will be explained below.

The relatively strong discharge pulse of the capacitor C1 will in fact generally necessitate restrictive measures for protecting the receiving circuit. As indicated in the drawing, it is advantageous to provide at least two groups of coil sections L2′, L2″, in particular flat ones, for the antenna L2. The number of windings times the area should be of the same magnitude for the two coil sections but should be connected in series with opposite polarity, so that the voltage induced by the excitation coil L1 compensates itself to a first approximation. For example, in assembling the antenna coils L1, L2, it would be possible for the coil L1 to be rectangular if the receiving coil L2 were installed as a symmetric "8" (in the manner shown). Hence, the signal at the point of intersection of the two coil sections L2′ and L2″ is virtually zero, whereas the signal is largest at the outsides of these coil sections. In the embodiment described, the signal is also taken from this point (the outside) of the coil section L2″.

The signal taken from the coil section L2″ is then expediently fed to a limiting circuit (circuit 7) before it is transmitted to the actual receiving circuit. This limiting circuit contains, on the input side, a limiting transformer T which is preferably in the form of a three-coil ferrite transformer, in particular of relatively small magnetic cross-section. This measure is sufficient to lead to a first reliable limit and hence to protection of the subsequent receiving circuit, since, in addition to any step-down transformation, the saturation of the ferrite core having a magnetic cross-section which is small (relative to the signal) constitutes a further limitation of the signal delivered.

A center tap, which is earthed, is provided at the secondary side of the transformer T.

An alternative or additional measure may consist in the arrangement (provided on the output side of the ferrite transformer T) of a diode circuit D having diodes connected antiparallel. Silicon diodes and a low junction capacitance are preferred. It would also be possible to use Schottky diodes, which are correspondingly fast, but these are more expensive than the silicon diodes mentioned.

In between, circuit 7 has an amplifier A which is expediently in the form of a push-pull amplifier, in particular a fully balanced push-pull amplifier. This too is a protective measure, by means of which the in-phase disturbance signals, in particular those transmitted capacitatively to the receiving antenna L2, are effectively suppressed. At the same time, the cross-modulation products which occur in the event of overmodulation are reduced.

It would not only be impractical but would also tend to be disadvantageous if the click signal of the discharge pulse of the capacitor C1 were also fed to the receiving circuit. On the one hand, the receiving circuit would be subjected to a great load and would inevitably become more expensive as a result of additional safety measures; on the other hand, the intention is in fact not to check the discharge pulse itself but any post-oscillation of the oscillating circuit of the label E, if the latter remains undestroyed.

A simple measure for overcoming this difficulty comprises arranging a time switch 8 in the receiving circuit, which switch 8 closes the receiving circuit only a predetermined time after delivery of the discharge pulse via the antenna L1. A precondition of this is of course that the transmitting circuit and receiving circuit are synchronized with one another, i.e. the switch 8 is controlled by the transmitting circuit. For this purpose, a control line 13 connects the control input of switch 8 to the switching system (the elements LDR, 1–5) which discharges the capacitor C1. In principle, the control line 13 could be connected directly to the circuit of the capacitor C1 or to the switch 5 but, for dimensional reasons, this is generally not preferred. It is more advantageous to connect the control line 13 to the output of the pulse generator 4 (or one of the abovementioned alternate circuits). The time lag from delivery of the discharge pulse to closing of the switch 8 is determined by a timing element integrated in the switch 8, for example a monoflop, but the timing element or monoflop may also be provided separately in the line 13. The time lag is at least 2 μs but must not be too long. A range of 5 to 30 μs appears to be optimal. Thereafter, however, the switch 8 should also not remain open too long, in order as far as possible to exclude disturbance signals. An opening time of 10 μs to not more than 60 μs, preferably not more than 50 μs, is quite satisfactory.

Thus, as soon as the discharge pulse has been delivered from the capacitor C1 to the antenna L1 (instead of capacitor C1, any energy source of appropriate power could be provided), the abovementioned, predetermined time elapses before the closing of the switch 8, which time may be set by an adjusting means which is not shown. This time is chosen so that the interfering oscillations generated in the system by the excitation pulse from the antenna L1 have decayed to such an extent that a signal which originates from a label E which at worst has remained undestroyed can be picked up at a significant level.

If the switch 8 is closed and the receiving antenna L2 receives a post-oscillation from a label E which has remained undestroyed, these oscillations are expediently integrated in an integrator 9. This too may constitute a protection from interfering frequencies, since a threshold switch 10 is preferably down-circuit of the integrator 9, so that a few interfering oscillations are not sufficient to exceed the switching threshold of the threshold switch 10. In practice, the switch 10 serves as a comparator with a predetermined value, namely its threshold value, which in any event can be adjusted by means of a trimming resistor, which is not shown.

In practice, integrator 9 and threshold switch 10 form the recognition circuit for a resonance label E which has remained capable of oscillation. If desired, the recognition circuit may be of any form, as known from radio and radar technology. At the output of this recognition circuit there is an appropriate evaluation circuit which is in the form of a pure indicator having an acoustic indicating means 11 and/or a visual display means 12, so that, for example, the checkout assistant is made aware of the fact that the deactivation process must be repeated. However, in order to automate the further deactivation process, the evaluation circuit can also possess, in the manner described, a signal line 14 which supplies the switching system (LDR, 1–5), which discharges the capacitor C1, directly with a signal to activate a further switching on process.

It has already been mentioned above that the switching system (LDR, 1–5) can be implemented in a very wide variety of ways, and accordingly the output line 14 too can trigger a further switching process at various points. For example, it would be possible to position the line 14 at the input of the timing element 2 so that the latter is switched on alternatively by the sensor LDR or via the line 14. However, it is simpler to provide the abovementioned OR element 3 and position the line 14 at its second input, so that the pulse generator 4 delivers pulses (i.e. at least one pulse) for the duration of a signal transmitted via the line 14, in order finally to deactivate the still undestroyed label E. This makes it easier to avoid false alarms.

It has already been mentioned that, instead of a capacitor C1, it is possible in principle to use any other energy source of appropriate power. In the latter case, there will in general be no needle pulses, and it may even be the case that pulse-forming stages are then necessary. The deactivation test described, employing the receiving circuit (L2, 7–12), could also be carried out in a conventional manner, in particular if the test is carried out at a place other than the deactivation site, for example at the packaging counter. In this case, however, the advantages achieved by the invention, such as the rapidity, etc., are lost if frequencies which are tuned as exactly as possible are used.

A large number of modifications are possible within the scope of the invention; for example, a capacitor C1 could be replaced with a plurality of such capacitors, which are either connected parallel to one another or, preferably, switched on in succession to deliver one discharge pulse each. To ensure deactivation of the label, it may be advantageous if the capacitors switched on in succession and thus discharged are of increasing size. It is of course also the case that the voltage converter 6 is in principle not absolutely essential but, by increasing the charging voltage, is capable of substantially reducing the charging time, with the result that the processes can take place even more rapidly.

It is also possible to modify the receiving antenna L2, which is virtually in the form of a compensated variometer and accordingly may assume all forms known for this use.

I claim:

1. A process for deactivating a resonance label in which the latter is excited by means of an energy-supplying transmitter without requiring contact between the resonance label and the transmitter, wherein a single discharge pulse, in the form of a click signal, is delivered via the transmitter.

2. A process as claimed in claim 1, wherein the discharge pulse has the shape of a needle pulse.

3. A process as claimed in claim 1, wherein at least two, individual discharge pulses with intermediate pulse intervals are delivered.

4. A process as claimed in claim 3, wherein the pulse intervals between said discharge pulses are of irregular duration with a random distribution.

5. A process as claimed in claim 3, wherein the pulse intervals between said discharge pulses are of irregular duration varying according to a law.

6. A process as claimed in claim 1, wherein, after delivery of the discharge pulse, at least one excitation signal for the resonance label is delivered in order to check that deactivation has taken place, any resonance signal of the label being picked up via a receiving circuit, and the receiving circuit is switched on only after a predetermined time interval after delivery of the deactivating discharge pulse, the predetermined time being at least 2 $\mu$s, and, the open time during which the receiving circuit is switched on lasts 10 $\mu$s to 60 $\mu$s.

7. A process as claimed in claim 6, wherein said excitation signal includes at least one further discharge pulse.

8. A process as claimed in claim 6, wherein said receiving circuit is switched on after a predetermined time interval of 5 $\mu$s to 30 $\mu$s after delivery of the deactivating discharge pulse.

9. A process as claimed in claim 6, wherein said open time during which the receiving circuit is switched on lasts for not more than 50 $\mu$s.

10. A circuit arrangement for carrying out the process as claimed in claim 1, wherein at least one discharge capacitor is connected in series with a transmitting antenna and is rechargeable via a switching system.

11. A circuit arrangement as claimed in claim 10, wherein branch resistor means is provided with the discharge capacitor, for increasing the charging voltage.

12. A circuit arrangement as claimed in claim 10, wherein the discharge capacitor has a capacitance of not more than 60 nF.

13. A circuit arrangement as claimed in claim 12, wherein said discharge capacitor has a capacitance of 10 nF $\pm 5$.

14. A circuit arrangement as claimed in claim 10, wherein a receiving circuit is provided with a receiving antenna for checking the deactivation of the resonance label, and comprises at least one of the following features:

(a) the receiving antenna is in the form of a compensated variometer having at least two coil sections;
(b) the receiving circuit possesses, on the output side, at least one visual and/or acoustic indicating means;
(c) a transformer is down-circuit of the receiving antenna;
(d) a balanced push-pull amplifier is down-circuit of the receiving antenna;
(e) in order to limit the receiving signal, a limiting circuit is provided; and
(f) an integrator is down-circuit of the receiving antenna.

15. A circuit arrangement as claimed in claim 14, wherein said receiving antenna is in the form of a compensated variometer having at least two coil-sections in the form of a symmetric figure-eight.

16. A circuit arrangement as claimed in claim 14, wherein said transformer is a three-coil ferrite transformer with a relatively small magnetic cross-section.

17. A circuit arrangement as claimed in claim 14, wherein said limiting circuit has antiparallel-connected silicon diodes having a relatively low junction capacitance.

18. A claim as claimed in claim 14, wherein an integrator with a down-circuit comparator is down-circuit of the receiving antenna.

19. A circuit arrangement as claimed in claim 10, wherein the switching system has at least one of the following features:

(a) it possesses a sensor for the goods passing said sensor and/or the resonance label;
(b) it possesses a pulse generator for delivering at least two single pulses in succession after a pulse interval, and by means of which a switch in the circuit of the discharge capacitor is controlled; and
(c) it is switchable via an OR element, one input of which is connected to the receiving circuit for checking the deactivation of the resonance label.

20. A circuit arrangement as claimed in claim 19, wherein said pulse generator is switchable via a timing element.

21. A circuit arrangement as claimed in claim 10, wherein the switching system is connected to a time switch in the receiving circuit for checking the deactivation of the resonance label, and switching on this receiving circuit after a time lag.

* * * * *

UNITED STATES PATENT AND TRADEMARK OFFICE

CERTIFICATE OF CORRECTION

PATENT NO. : 4,906,974

DATED : March 6, 1990

INVENTOR(S) : Jurgen Rehder

It is certified that error appears in the above-identified patent and that said Letters Patent is hereby corrected as shown below:

The title page should be deleted to appear as per attached title page.

Signed and Sealed this

Second Day of July, 1991

*Attest:*

HARRY F. MANBECK, JR.

*Attesting Officer*

*Commissioner of Patents and Trademarks*

United States Patent [19]
Rehder

[11] Patent Number: 4,906,974
[45] Date of Patent: Mar. 6, 1990

[54] PROCESS FOR DEACTIVATING A RESONANCE LABEL, AND CIRCUIT ARRANGEMENT FOR CARRYING OUT THE PROCESS

[75] Inventor: Jürgen Rehder, Bexbach-Höchen, Fed. Rep. of Germany

[73] Assignee: Durgo AG, Switzerland

[21] Appl. No.: 185,037

[22] Filed: Apr. 22, 1988

[30] Foreign Application Priority Data

Apr. 23, 1987 [CH] Switzerland ........................ 1564/87

[51] Int. Cl.[4] ........................ G08B 13/24; H01Q 1/36; H05K 1/16

[52] U.S. Cl. .................................... 340/551; 340/572; 343/895; 361/402

[58] Field of Search ................... 340/551, 572, 825.57; 343/895; 361/402

[56] References Cited

U.S. PATENT DOCUMENTS 4,686,516 8/1987 Humphrey ........................ 340/572
4,736,207 4/1988 Siikarla et al. ...................... 343/895
4,797,785 1/1989 Jorgensen ........................ 361/402

*Primary Examiner*—Glen R. Swann, III
*Assistant Examiner*—Thomas J. Mullen, Jr.
*Attorney, Agent, or Firm*—Ostrolenk, Faber, Gerb & Soffen

[57] ABSTRACT

A resonance label (E) is deactivated by transmitting only a single discharge pulse which produces only a click signal instead of an oscillation and destroys the label (E). A discharge capacitor (C1) which is connected in series with a transmitting antenna (L1) and is rechargeable via a switching system (LDR, 1-5) preferably serves as the energy source for delivering the discharge pulse.

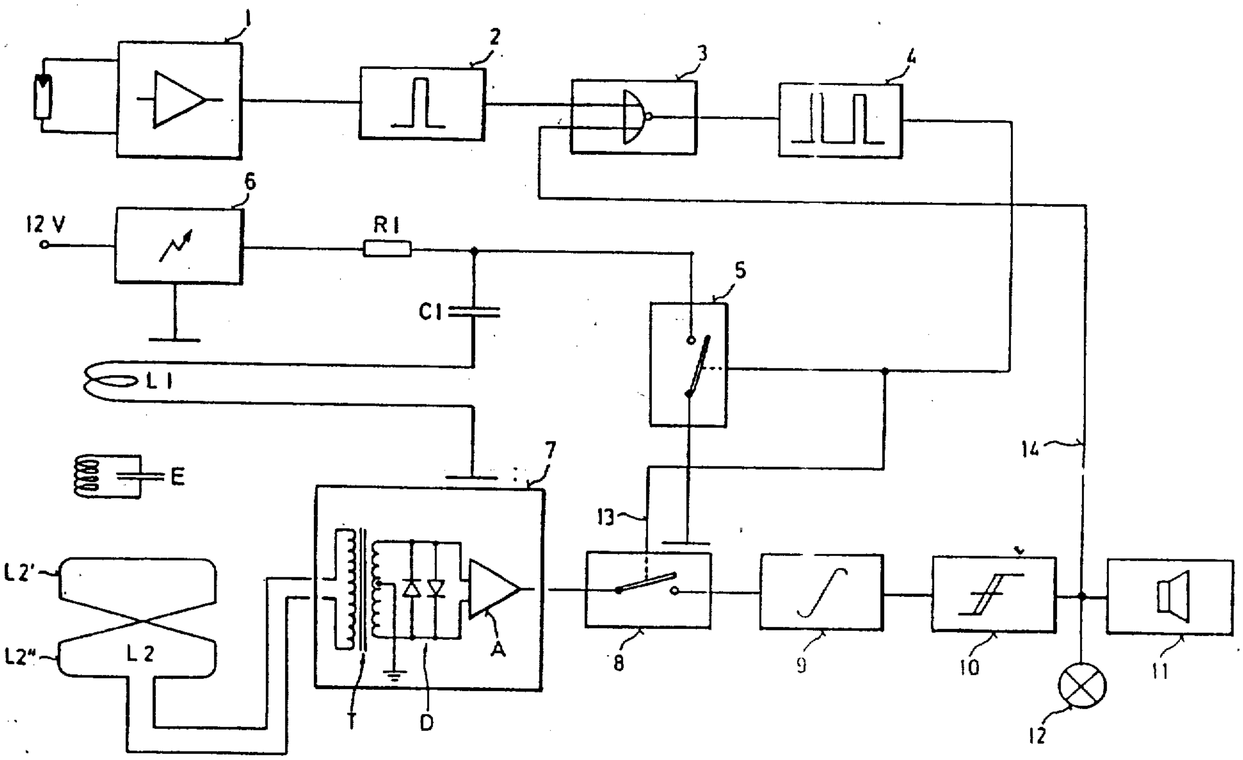

21 Claims, 1 Drawing Sheet